(12) United States Patent
Suyama

(10) Patent No.: US 8,095,696 B2
(45) Date of Patent: Jan. 10, 2012

(54) CONTROL METHOD FOR REWRITING FIRMWARE ON AN ELECTRONIC DEVICE

(75) Inventor: Akihiko Suyama, Irvine, CA (US)

(73) Assignee: Yahama Corporation, Hamamatsu-shi (JP)

( * ) Notice: Subject to any disclaimer, the term of this patent is extended or adjusted under 35 U.S.C. 154(b) by 1217 days.

(21) Appl. No.: 11/663,116

(22) PCT Filed: Sep. 15, 2005

(86) PCT No.: PCT/JP2005/017045
§ 371 (c)(1),
(2), (4) Date: Mar. 16, 2007

(87) PCT Pub. No.: WO2006/030861
PCT Pub. Date: Mar. 23, 2006

(65) Prior Publication Data
US 2007/0266189 A1    Nov. 15, 2007

(30) Foreign Application Priority Data
Sep. 17, 2004    (JP) .................................. 2004-271944

(51) Int. Cl.
*G06F 3/00* (2006.01)
(52) U.S. Cl. .............................. 710/8; 717/168; 717/174
(58) Field of Classification Search ........................ None
See application file for complete search history.

(56) References Cited

U.S. PATENT DOCUMENTS

| 5,428,755 | A | 6/1995 | Imai et al. | |
|---|---|---|---|---|
| 6,321,979 | B1 * | 11/2001 | Hanagata | 235/375 |
| 7,149,692 | B1 * | 12/2006 | Wu | 704/270 |
| 2005/0182822 | A1 * | 8/2005 | Daniel et al. | 709/213 |

FOREIGN PATENT DOCUMENTS

| EP | 1 471 524 A1 | 10/2004 |
|---|---|---|
| JP | A-H5-265739 | 10/1993 |
| JP | A-H8-76989 | 3/1996 |
| JP | A-H10-133867 | 5/1998 |
| JP | 2000331416 | 11/2000 |
| JP | 2002-149428 | 5/2002 |
| JP | A-2003-91428 | 3/2003 |

OTHER PUBLICATIONS

European Patent Office Search Report (European Patent Application No. 05783283.4, dated Jul. 21, 2008).
Japanese Patent Office "Notification of Reasons for Refusal" re Patent Application No. 2004-340535 dated Nov. 4, 2010, 5 pages.
European Patent Office "Office Action" re Patent Application No. 05 783 283.4-2212 dated Feb. 17, 2011, 4 pages.
International Standard (ISO/IEC) "Information technology—Coding of moving pictures and associated audio for digital storage media at up to about 1,5 Mbit/s—Part 3", Ref. No. ISO/IEC 11172-3 dated Aug. 1, 1993, First edition, 42 pages.

* cited by examiner

*Primary Examiner* — Eron J Sorrell

(74) *Attorney, Agent, or Firm* — Pillsbury Winthrop Shaw Pittman LLP

(57) ABSTRACT

An electronic device includes: a plurality of input terminals; and a control unit in which an operation for determining contents of a digital signal inputted through one input terminal of the plurality of input terminals is repeated while the input terminal is switched to another, and when it is confirmed that a predetermined identifier is included in a digital signal inputted through a certain input terminal, processing is then performed upon real data included in the digital signal inputted through the certain input terminal.

8 Claims, 6 Drawing Sheets

FIG. 3

| | | | | | | | | | | | | | | | | |
|---|---|---|---|---|---|---|---|---|---|---|---|---|---|---|---|---|
| 1 | 16 | 15 | 14 | 13 | 12 | 11 | 10 | 9 | 8 | 7 | 6 | 5 | 4 | 3 | 2 | 1 | 16 | 15 |

R DATA: 1 1 1 1 0 0 0 0 0 0 0 0 1 1 1 1

FIRMWARE REWRITING DATA: 1 0 0 0 1

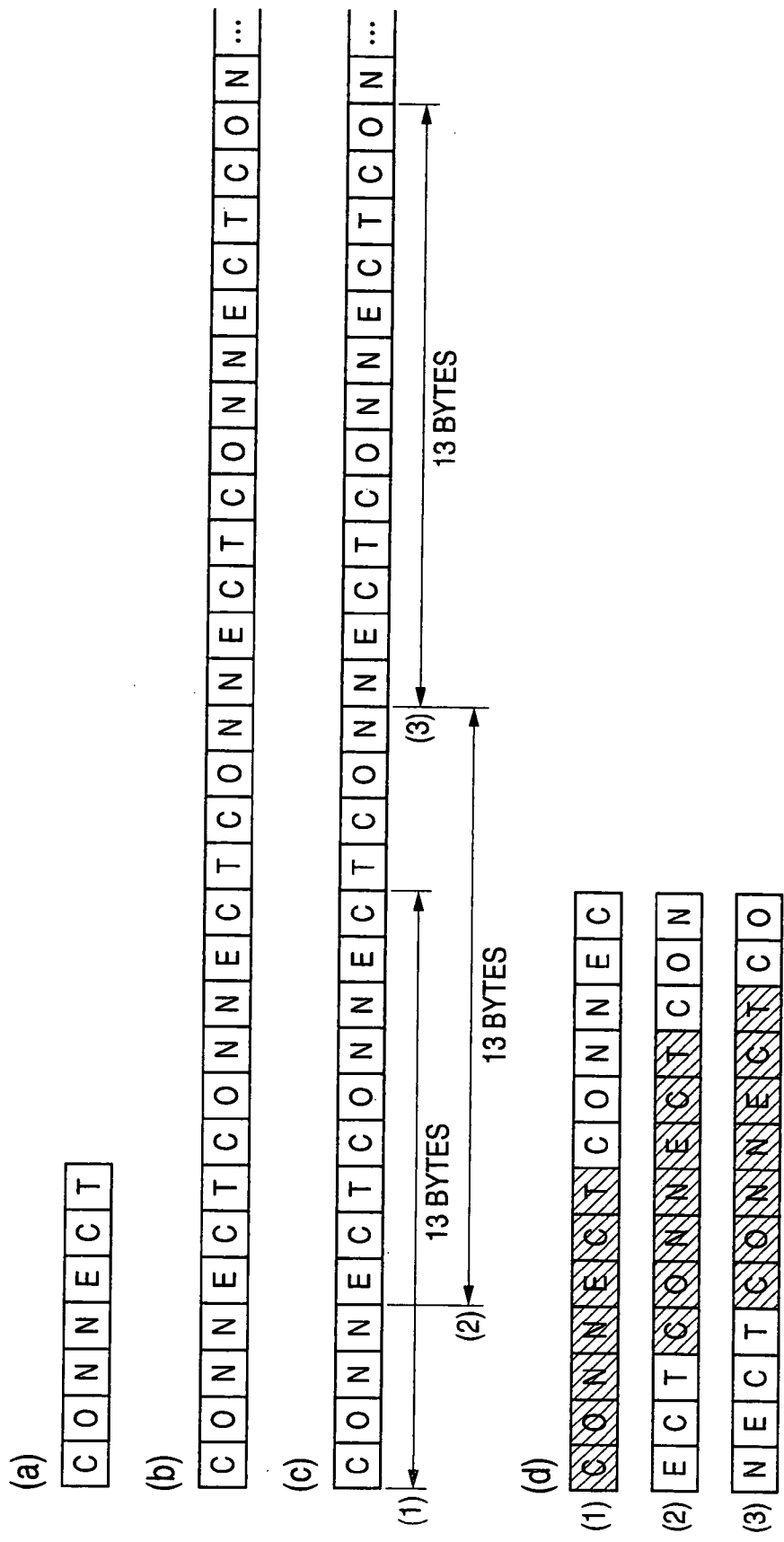

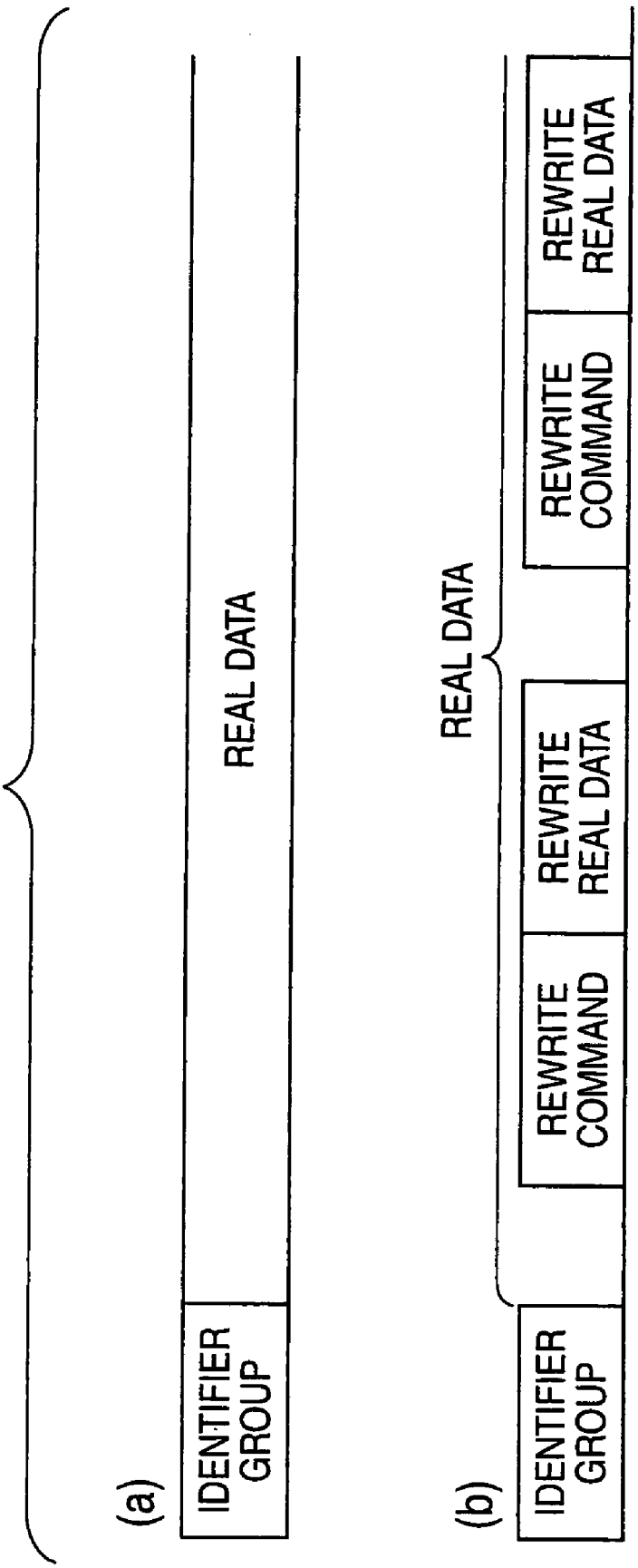

CONTROL METHOD FOR REWRITING FIRMWARE ON AN ELECTRONIC DEVICE

This application is the National Phase of International Application PCT/JP2005/017045, filed Sep. 15, 2005 which designated the U.S. and that International Application was not published under PCT Article 21(2) in English.

TECHNICAL FIELD

The present invention relates to an electronic device having a plurality of input terminals, a control method aimed at the electronic device, a digital signal generating method and a storage medium.

BACKGROUND ART

An electronic device often has a non-volatile memory such as ROM where firmware, that is, programs, control data, etc. has been recorded. The programs stored in this non-volatile memory are executed to perform various functions. Recently, a rewritable non-volatile memory such as a flash memory has been used as such firmware. In many electronic devices that have been already provided, such firmware can be rewritten after factory shipment so that another function can be added to the firmware or the version of the firmware can be upgraded. Patent Document 1 is one of technical documents about rewriting of such firmware. This Patent Document 1 discloses an audio signal processing apparatus having a reproduction mode and an upgrade mode. In the reproduction mode, digital data read from a CD are reproduced as music. On the other hand, in the upgrade mode, firmware is rewritten by digital data read from an upgrade CD so that functions can be upgraded.

Patent Document 1: JP-A-2002-149428

DISCLOSURE OF THE INVENTION

Problem that the Invention is to Solve

Some audio signal processing apparatus has a plurality of input terminals. The audio signal processing apparatus can receive signals from a plurality of devices such as a CD playback apparatus and a DVD playback apparatus connected to these input terminals, and perform processing upon the received signals. The aforementioned technique of Patent Document 1 can be also applied to such an audio signal processing apparatus. However, if the technique is applied to the apparatus, there will arise a problem troublesome for a user. First, assume that a plurality of apparatuses such as a CD playback apparatus are connected to the audio signal processing apparatus, and a disk where data to rewrite firmware have been recorded is loaded into one playback apparatus (for example, regarded as a playback apparatus A) of them by the user. In this case, the user has to find, of the plurality of input terminals provided in the audio signal processing apparatus, an input terminal connected to the playback apparatus A, and perform an operation to specify the input terminal on the audio signal processing apparatus. The reason will be described. That is, the audio signal processing apparatus has the plurality of input terminals. Unless the user performs an operation to specify the input terminal, the audio signal processing apparatus cannot know the input terminal through which the data to rewrite the firmware will be supplied. However, such an operation is troublesome for the user because the user has to follow a cable for signal output of the playback apparatus A in order to find, of the plurality of input terminals to which various apparatuses have been connected, the input terminal to which the playback apparatus A has been connected. The cables to connect the audio signal processing apparatus and the playback apparatuses generally lie behind the respective apparatuses. It is therefore necessary for the user to perform this operation while seeing the back of the audio signal processing apparatus. When the audio signal processing apparatus and a plurality of playback apparatuses connected thereto are received in one rack, such an operation becomes extremely troublesome.

The present invention was developed in consideration of the circumstances described above. An object of the invention is to provide an electronic device in which a user does not have to specify an input terminal to which data to be processed will be supplied, and the data can be processed with ease.

Means for Solving the Problem

In a preferred mode of the present invention, an electronic device includes a plurality of input terminals, and a control unit in which an operation for determining contents of a digital signal inputted through one input terminal of the plurality of input terminals is repeated while the input terminal is switched to another, and when it is confirmed that a predetermined identifier is included in a digital signal inputted through a certain input terminal, processing is then performed upon real data included in the digital signal inputted through the input terminal.

Assume that a user wants to give some data to the electronic device to perform arbitrary processing upon the data. In this case, it will go well if an identifier group and real data are reproduced, for example, from a storage medium, and the identifier group and the real data are supplied to an arbitrary input terminal of the electronic device in this order. The control unit of the electronic device repeats the operation to determine the contents of a digital signal inputted through one input terminal of the plurality of input terminals, while switching the input terminal to another. In this process, assume that it is confirmed that the identifier is included in a digital signal inputted through a certain input terminal. In this case, the control unit then performs processing upon real data included in the digital signal inputted through the input terminal. In this manner, according to the present invention, the user does no have to specify an input terminal through which real data will be supplied, but can make the electronic device perform processing on the real data.

BRIEF DESCRIPTION OF THE DRAWINGS

FIG. 3 is a time chart showing the relationship between a data signal and firmware rewriting data in the embodiment.

FIG. 5 is a diagram showing a principle for detection of an identifier in the embodiment.

FIG. 6 is a diagram showing an example of a configuration of real data in the embodiment.

BEST MODE FOR CARRYING OUT THE INVENTION

An embodiment of the present invention will be described below with reference to the drawings.

Figure 1:
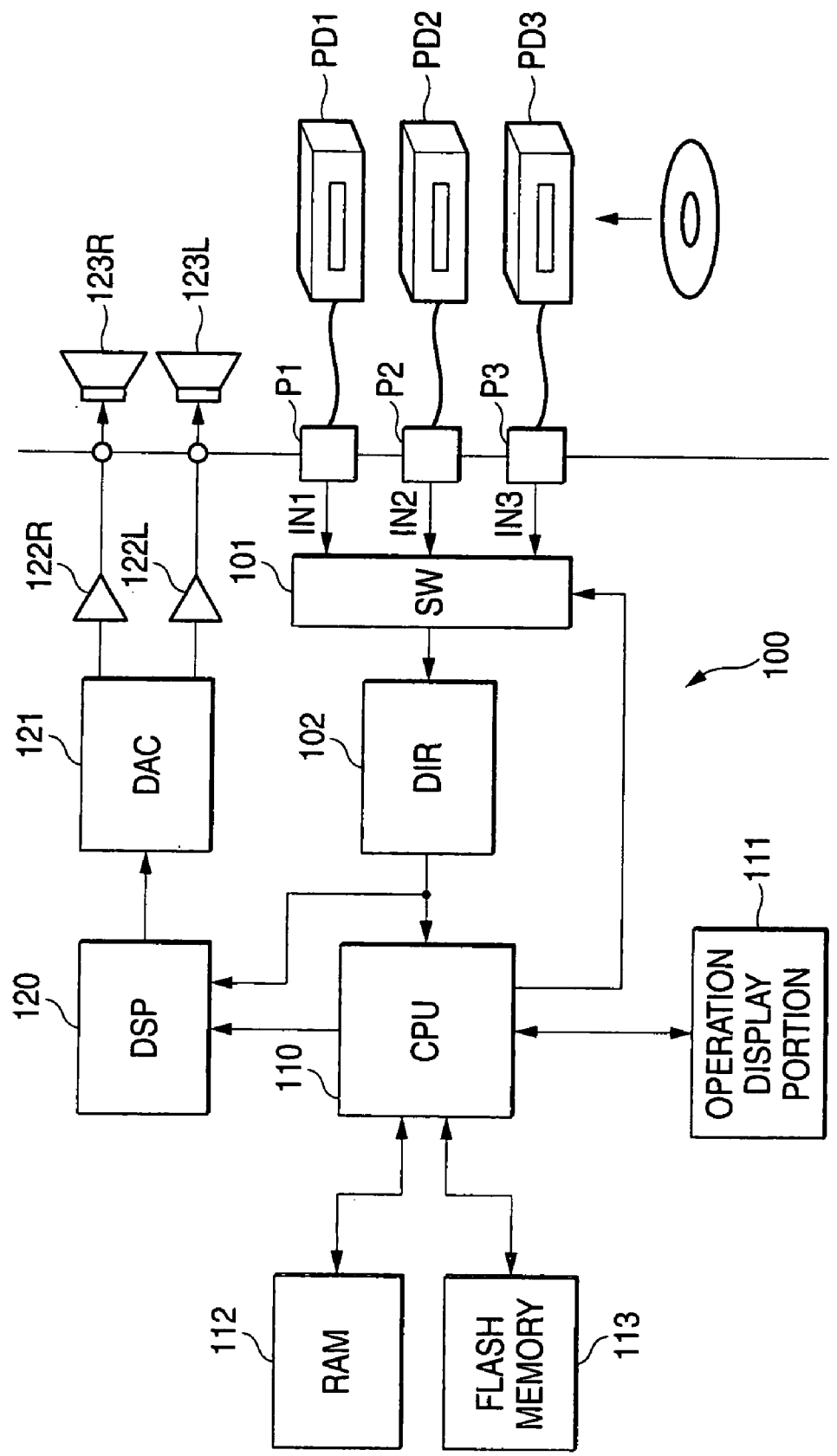
FIG. 1 is a block diagram showing a configuration of an audio signal processing apparatus according to an embodiment of the present invention.

FIG. 1 is a block diagram showing the configuration of an audio signal processing apparatus 100 which is an embodiment of the electronic device according to the present invention. This audio signal processing apparatus 100 has a plurality of input terminals for receiving digital audio signals from a CD playback apparatus, a DVD playback apparatus, etc. Playback apparatuses which output digital audio signals conformable to SPDIF (Sony/Philips Digital Interface Format) Standard which is one of digital audio interface standards are connected to these input terminals. In the example shown in FIG. 1, three input terminals P1 to P3 are provided in the audio signal processing apparatus 100. However, the number of input terminals is optional. In the example shown in FIG. 1, three playback apparatuses PD1 to PD3 are connected to the input terminals P1 to P3. However, any playback apparatus may be connected to any input terminal.

The playback apparatuses PD1 to PD3 are apparatuses for reproducing digital audio signals from media such as CD, DVD, etc. A user can load any one of the playback apparatuses PD1 to PD3 with a disk where arbitrary music has been recorded. Thus, the user can enjoy reproducing the music. In this embodiment, a disk where firmware rewriting data for upgrading the functions of the audio signal processing apparatus 100 have been recorded may be loaded into one of the playback apparatuses PD1 to PD3. Here, the firmware rewriting data are composed of a plurality of consecutive identifiers indicating the data are firmware rewriting data, and real data following the identifier group. The real data are data which will be actually used for rewriting the firmware.

In this embodiment, the playback apparatus to be loaded with a disk where such firmware rewriting data have been recorded is not fixed. Such a disk may be loaded into any one of the playback apparatuses PD1 to PD3.

The input terminals P1 to P3 are connected to a switch portion 101. This switch portion 101 is a circuit which selects one input terminal of the input terminals P1 to P3 in accordance with a command from a CPU 110, and outputs a digital audio signal inputted through the selected input terminal to a digital interface receiver (hereinafter abbreviated to "DIR") 102. Some DIR may include a switch for selecting one of input signals from a plurality of input terminals. When the DIR 102 belongs to such a kind of DIR, a configuration may be arranged as follows. That is, the CPU 110 sends the DIR 102 information for specifying one of the plurality of input terminals P1 to P3 from which a signal should be received. The DIR 102 selects an input signal in accordance with this information.

The DIR 102 is a circuit which extracts data signals of an L-ch (left channel) and an R-ch (right channel) from an SPDIF-format digital audio signal inputted through the switch portion 101, converts the data signals into a signal with a format conformable to an I2S bus (The Inter-IC Sound Bus) or the like, and outputs the signals.

Figure 2:
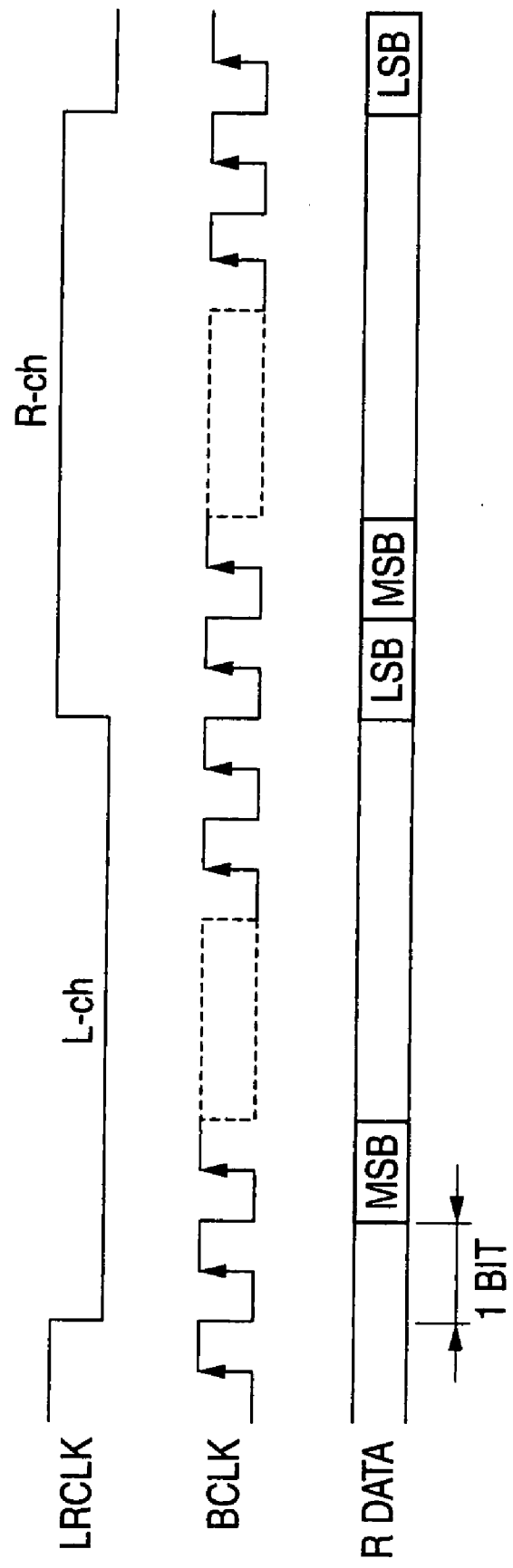
FIG. 2 is a waveform chart showing signals included in an I2S bus in the embodiment.

FIG. 2 shows an output signal of DIR 102 byway of example. The output signal of the DIR 102 is composed of a word clock LRCLK, a data signal RDATA and a bit clock BCLK. The word clock LRCLK is formed as a frame repeated in a fixed period of time, and synchronized with switching of the frame. The data signal RDATA is extracted from an SPDIF-format digital audio signal. The bit clock BCLK is synchronized with each bit forming the data signal RDATA. The data signal RDATA of each frame includes a data signal for the L-ch in the first half and a data signal for the R-ch in the second half. The word clock LRCLK has an L-level in the first half of each frame and an H-level in the second half of the frame so as to allow a circuit receiving the frame to process the data signals of the L-ch and the R-ch individually and selectively. The data signal RDATA starts after a delay corresponding to one period of the bit clock BCLK from the trailing edge of the word clock LRCLK. In the I2S bus standard, the data length of one frame is not defined but optional. The DIR 102 according to this embodiment outputs a 16-bit data signal for each of the L-ch and the R-ch as a data signal of one frame.

As described above, in this embodiment, a disk where firmware rewriting data have been recorded may be loaded into one of the playback apparatuses PD1 to PD3, and the data read from this disk may be supplied to the audio signal processing apparatus 100. The firmware rewriting data are supplied to the audio signal processing apparatus 100 as an SPDF-format signal in the same manner as a digital audio signal of music or the like. In this embodiment, however, the firmware rewriting data are processed by software. High-speed processing cannot be expected in this process. In consideration of this fact, there is taken a step in which the time resolution of constituent bits of the firmware rewriting data is made substantially lower than the time resolution of constituent bits of a digital audio signal of music or the like.

Specifically, information corresponding to one bit of the firmware rewriting data is expressed by use of a predetermined number of consecutive bits in a digital audio signal. FIG. 3 shows an example of a data signal RDATA outputted from the DIR 102 when this step is taken. In this example, information corresponding to one bit of the firmware rewriting data is expressed by use of four consecutive bits constituting a data signal. Specifically, 4-bit firmware rewriting data "1001" are expressed by a 16-bit data signal "1111000000001111". The four consecutive bits "1111" in the data signal correspond to the bit "1" in the firmware rewriting data, and the four consecutive bits "0000" in the data signal correspond to the bit "0" in the firmware rewriting data. When this step is taken, a data signal can be sampled based on a low-speed clock obtained by dividing the bit clock BCLK into four, so that constituent bits of the firmware rewriting data can be acquired. Thus, it is possible to lighten the load for processing the firmware rewriting data by software or the like.

The CPU 110 is a control center for controlling each part of the audio signal processing apparatus 100. An operation display portion 111, a RAM 112 and a flash memory 113 are connected to this CPU 110. The operation display portion 111 has a function as a man-machine interface. The operation display portion 111 has various operators such as push buttons for receiving various commands from the user, and various indicators such as LCD for providing messages to the user. The RAM 112 is used as a work area when CPU 110 is performing various controls. The flash memory 113 is incorporated as firmware in the audio signal processing apparatus 100. The flash memory 113 stores OS and various application programs. As one of the application programs written in this flash memory 113, there is an upgrade program for rewriting the flash memory 113.

Important ones of processes to be performed in the audio signal processing apparatus 100 include a process for reproducing, as sound, a digital signal supplied through the DIR 102, and a process for rewriting the flash memory 113 serving as firmware.

In order to perform the former process, the CPU 110 controls the DIR 102 and a digital signal processor (hereinafter referred to as DSP) 120 in a stage following the DIR 102. This DSP 120 reads constituent bits of the data signal RDATA in sync with the trailing edge of the bit clock BCLK, separates the data signal RDATA into an L-ch data signal and an R-ch data signal based on the word clock LRCLK, performs a decoding process, an acoustic field providing process, etc. upon the respective channel data signals, and outputs the processed channel data signals. The CPU 110 sets parameters for the DSP 120 in accordance with a command or the like given through the operation display portion 111 by the user. The parameters serve for the decoding process or the acoustic field providing process. Digital audio signals of the two L and R channels outputted from the DSP 120 are converted into analog audio signals by a DAC 121 respectively. The analog audio signals of the two channels are amplified by amplifiers 122L and 122R, and released from left and right speakers 123L and 123R respectively.

In order to perform the latter process, as soon as a command START to change over to an input terminal selection mode is received from the operation display portion 111, the CPU 110 copies the upgrade program from the flash memory 113 to the RAM 112, and executes the upgrade program in the RAM 112. In this upgrade program executing process, the CPU 110 intercepts and analyzes digital signals sent from the DIR 102 to the DSP 120 while selecting the input terminals P1 to P3 sequentially every predetermined period of time by means of the switch portion 101. Thus, the CPU 110 determines, of the input terminals P1 to P3, a terminal to which firmware rewriting data will be inputted. After the corresponding input terminal is determined, the CPU 110 continues to select the input terminal by means of the switch portion 101, and rewrites the flash memory 113 by use of digital signals inputted through the input terminal. The details of this rewriting of the firmware will be made clear in the description of the operation of this embodiment in order to avoid redundant description.

Next, the operation of this embodiment will be described. First, assume that the user obtains a disk where firmware rewriting data have been recorded, loads the disk into one of the playback apparatuses PD1 to PD3, for example, the playback apparatus PD1, operates the operation display portion 111 to give the command START to change over to the input selection mode, and pushes down a playback button of the playback apparatus PD1. In response to such an operation, the following operation is performed in this embodiment.

First, in the audio signal processing apparatus 100, to which the command START to change over to the input selection mode has been given, the CPU 110 copies the upgrade program from the flash memory 113 to the RAM 112, and executes the copied upgrade program.

Figure 4:
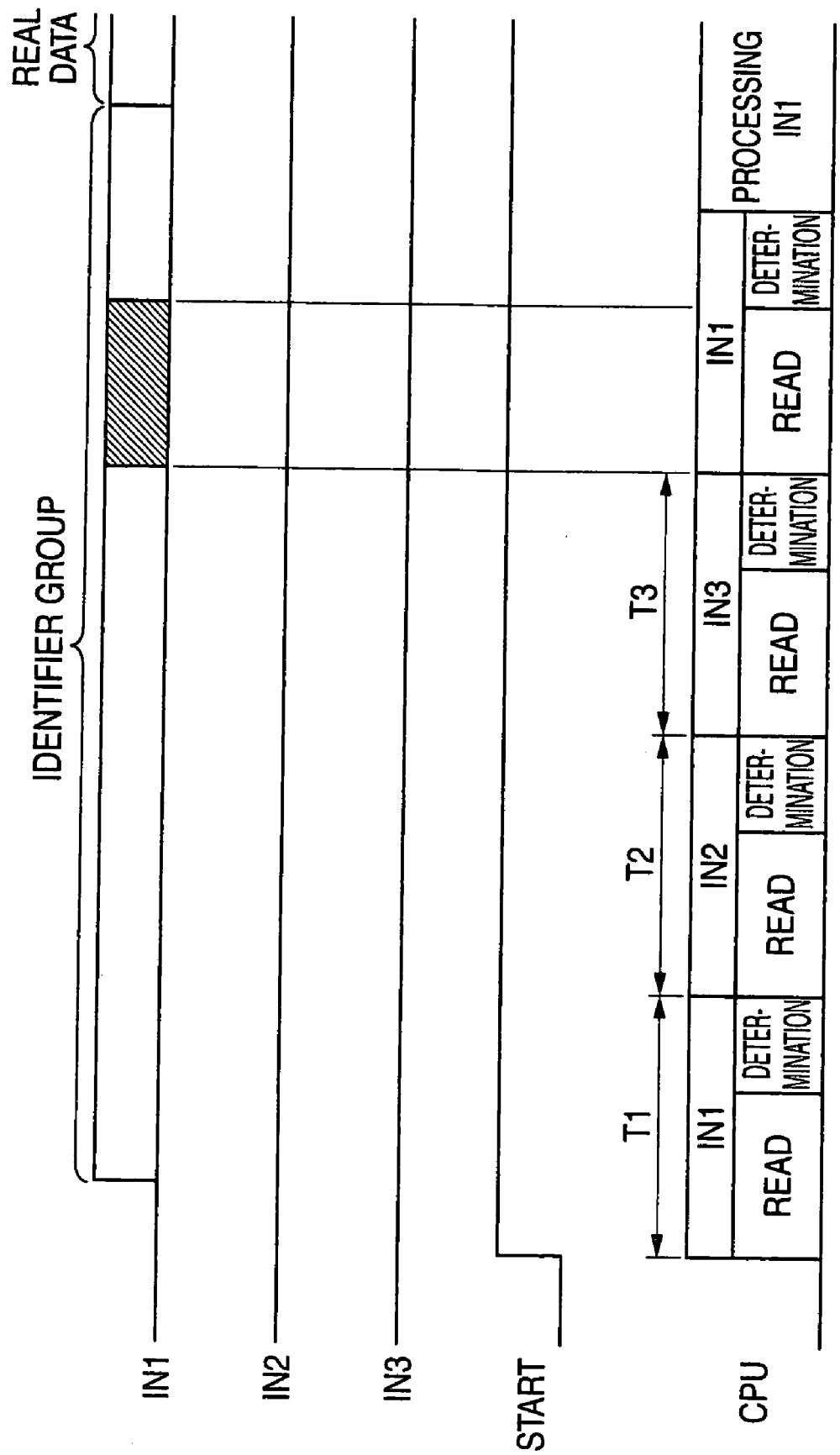
FIG. 4 is a time chart showing an operation of a CPU in the embodiment.

FIG. 4 is a time chart showing the operation of the CPU 110 in this upgrade program executing process. When the CPU 110 starts executing the upgrade program, the CPU 110 starts to control the switch portion 101 to switch so as to repeat an operation to select the input terminals P1-P3 sequentially every predetermined period of time.

Here, as long as the input terminal P1 is selected, data IN1 inputted through the input terminal P1 pass through the switch portion 101. The data IN1 are subjected to processing by the DIR 102 and outputted to the CPU 110. The CPU 110 performs a read process for a predetermined time. In the read process, the data signal outputted from the DIR 102 is sampled, for example, based on a clock obtained by dividing the bit clock BCLK into four as described above, and bits sampled sequentially are stored in a built-in buffer sequentially. After that, the CPU 110 performs a determination process for determining whether a bit sequence expressing an identifier is included in the bit sequence stored in the buffer. Here, no data are supplied from the playback apparatus PD1 to the DIR 102 through the input terminal P1 and the switch portion 101 before the playback button of the playback apparatus PD1 is pushed down. Thus, no data are outputted from the DIR 102. Alternatively, "0" may be outputted as data from the DIR 102 in such a case. In any case, the result of the determination process by the CPU 110 is negative in this case.

In the example shown in FIG. 4, the input terminal P1 is first selected by the switch portion 101, and the CPU 110 starts a read process corresponding to data IN1 before the playback apparatus PD1 starts reproducing the disk. The CPU 110 fails in reading an identifier in the read process. The result of the determination process is negative. After that, by switching of the switch portion 101, a read process and a determination process are performed over the input terminals P2 and P3. No identifier is supplied to the input terminals P2 and P3. Thus, the result of the determination process is negative.

After that, in the example shown in FIG. 4, the input terminal P1 is selected again by the switch portion 101, and the CPU 110 performs a process corresponding to the input data IN1. In this time, the playback apparatus Pd1 has already started reproducing firmware rewriting data. Accordingly, in the read process corresponding to the input data IN1 via the input terminal P1 in this time, an identifier is extracted from an output signal of the DIR 102 and stored in a buffer. In a determination process, a bit sequence expressing the identifier is discovered from a bit sequence in the buffer. In this manner, in order to ensure that the identifier will be discovered by the CPU 110, the identifier is repeated in a head portion of the firmware rewriting data in this embodiment, while the time length to repeat the identifier is made sufficient.

The CPU 110 ceases the switching operation of the switch portion 101 on and after detecting that the identifier is supplied via the input terminal P1, and the CPU 110 continues to process the data via the input terminal P1. Following the identifier group, real data to be used for rewriting the firmware are outputted soon as a data signal from the DIR 102. The CPU 110 rewrites the flash memory 113 using the real data.

Next, a specific example of design will be shown. In this design example, "CONNECT" made of seven one-byte characters is used as an identifier as shown in FIG. 5(*a*). As shown in FIG. 5(*b*), an identifier group where this identifier "CONNECT" is repeated a predetermined number of times is disposed in a head portion of firmware rewriting data. In this case, the CPU 110 samples a byte sequence from a data signal outputted from the DIR 102. On the assumption that A designates the number of bytes of an identifier, and X designates the number of acquired identifiers, the number of bytes of the byte sequence sampled in one read process can be obtained by:

$$(A*X)+(A-1) \quad (1)$$

For example, assume that the number of acquired identifiers X is 1 when the number of bytes A of an identifier is 7 as shown in FIG. 5(*a*). In this case, the number of bytes of the sampled byte sequence is (A*X)+(A−1)=7*1+7−1=13 bytes. The number of acquired identifiers X may be one. If the number X is increased, it is possible to lower the probability that a digital audio signal which does not serve as an identifier will be recognized as an identifier erroneously.

FIG. 5(*c*) shows a byte sequence obtained as follows. That is, in a period of time when the data signal including the constituent bits of the identifier group is outputted from the DIR 102, bits are sampled at an interval of 4 bits from the data signal. The sampled bits are collected eight by eight. FIG. 5(*d*) shows a byte sequence obtained in the buffer in the read process when three kinds of sections (1) to (3) in FIG. 5(*c*) are sampled from the byte sequence obtained from the data signal. When the number of bytes of the identifier is seven, it will be understood that the identifier "CONNECT" made of seven bytes can be always obtained in the buffer if the 13 bytes obtained by the aforementioned expression (1) are sampled from the data signal in the read process.

The number of repetitions of the identifier in the identifier group must be defined to match with the time required for determining the input terminal through which the identifier is inputted. The required time will be described below. Here, assume that the sampling frequency of the data signal outputted from the DIR 102 is 44.1 kHz, and one byte of data constituting the firmware rewriting data can be obtained from two samples of the data signal. In this case, in the read process, (A*X)+(A−1) bytes of data are sampled. Therefore, required time B for one read process is expressed by:

$$B=(2/44100)+\{(A*X)+(A-1)\} \quad (2)$$

In this case, assume that Y designates average required time per input terminal for the determination process, the switching, etc., and C designates the number of input terminals. In order to ensure that the identifier will be read in the read process, it will go well if the number of repetitions N of the identifier in the identifier group is defined as:

$$N=(B+Y)*(C+1)/\{(2/44100)*A\} \quad (3)$$

In the aforementioned expression (3), N is an integer obtained by rounding up fractions below decimal point in the result of the right-hand side arithmetic operation. (B+Y) in the numerator of the aforementioned expression (3) corresponds to an average value T (T=(T1+T2+T3)/3 in the example shown in FIG. 4) of both the required times for the read process and the determination process in FIG. 4. Accordingly, the numerator (B+Y)*(C+1) corresponds to the required time to perform at least one read process and one determination process for every input terminal. On the other hand, the denominator is the required time to read one identifier. The following fact will be understood from above. That is, N in the expression (3) expresses the smallest number of repetitions of the identifier in the identifier group required to continue to repeat the identifier during at least one read process and one determination process performed over every input terminal.

When the number of repetitions of the identifier in the identifier group is set at N times as shown in this expression (3), it is ensured that the identifier can be always obtained in the read process. For example, assume that, in the case where the input terminals P1 to P3 are provided and an identifier group is inputted through the input terminal P1, the read process is started with the input terminal P1 selected before reproduction of the identifier group is started, so that the identifier cannot be obtained from input data in the read process. Even in this case, if the number of repetitions N of the identifier in the identifier group is provided by the aforementioned expression (3), a constituent part of the identifier group will still remain in the data signal when another read process is then performed with the input terminal P1 selected again. It is therefore possible for the CPU 110 to obtain the identifier from the data signal in the read process performed again.

Various modes can be considered as those of real data following the identifier group. First, in a mode shown in FIG. 6(*a*), all the real data are data which will be actually used for rewriting the firmware. In this case, it will go well if the CPU 110 writes the real data following the identifier group into the flash memory 113 as soon as the CPU 110 detects the end of the identifier group.

In a mode shown in FIG. 6(*b*), a block constituted by a rewrite command and rewriting real data is repeated in the real data. The rewrite command includes the number of bytes of the rewriting real data following the rewrite command. In this case, the CPU 110 determines an input terminal through which the identifier will be inputted, decides to continue to acquire data from the input terminal, then monitors a data signal outputted from the DIR 102, and continues to determine whether a rewrite command is included in the data signal or not. When the CPU 110 finds the rewrite command, the CPU 110 extracts the number of bytes of rewriting real data following the rewrite command from the rewrite command, samples data of the extracted number of bytes from the data signal, and writes the sampled data into the flash memory 113. Such a process is repeated whenever a rewrite command is found. Thus, the flash memory 113 is rewritten. Emptiness may lie between one block and another, or digital audio signals of music or the like may be embedded therebetween.

According to this embodiment described above, the audio signal processing apparatus 100 determines through which input terminal the identifier is inputted, so as to determine the input terminal through which firmware rewriting data will be inputted. Accordingly the user can rewrite the firmware with ease without performing any operation to specify the input terminal. In this case, playback apparatuses may be connected to input terminals other than the input terminal through which the firmware rewriting data will be inputted. Further, the playback apparatuses may reproduce digital audio signals. When, for example, the user loads the playback apparatus PD1 with a disk where the firmware rewriting data have been recorded, and inputs a firmware rewriting instruction, digital audio signals of music may be reproduced from a disk in another playback apparatus PD2. In such a case, in the audio signal processing apparatus 100, during the period of time when the input terminal P2 is selected, digital signals corresponding to digital audio signals of music reproduced by the playback apparatus PD2 are outputted from the DIR 102, and the CPU 110 performs a read process and a determination process over the digital signals. However, in the case of a normal digital audio signal of music, a byte sequence sampled from an output signal of the DIR 102 can be regarded as random data. Accordingly, when an identifier of 7 bytes is acquired in the read process as in the aforementioned design example, the number of acquired bits is 7*8=56 bits. Each probability of occurrence of bits "1" and "0" is ½. The probability that 7 bytes sampled from the output signal of the DIR 102 will coincide with "CONNECT" accidentally is $(½)^{56}=1/(7.2*10^{16})$. That is, it can be said that it is practically impossible for the sampled 7 bytes to coincide with "CONNECT". According to this embodiment, even under the situation where playback apparatuses are connected to a plurality of input terminals and disks are reproduced by the playback apparatuses, an input terminal through which firmware rewriting data will be inputted can be determined accurately, and the firmware can be rewritten by data via the input terminal.

One embodiment of the present invention has been described above. Other embodiments can be conceived in the present invention, for example, as follows:

(1) In the aforementioned embodiment, the present invention was applied to an audio signal processing apparatus. The present invention is not limited to this, but can be applied to various audio devices (electronic devices) such as a CD player, a DVD player, an MD player, an HDD (Hard Disk) player, a memory player, etc., or various electronic devices other than the audio device if the electronic device uses firmware.

(2) The aforementioned embodiment was aimed at apparatus performing processing upon digital audio signals conformable to the SPDIF Standard. The present invention may be applied to digital signals with another format. In short, data located at predetermined timing positions in one frame with a predetermined format may be extracted to be subjected to a rewrite process.

(3) In the aforementioned embodiment, real data following an identifier group was used for rewriting firmware. The present invention has a fundamental idea as follows. That is, a plurality of input terminals are provided, and an operation to determine contents of a digital signal inputted through one input terminal of the plurality of input terminals is repeated while switching the input terminal to another. When it is confirmed that a predetermined identifier is included in a digital signal inputted through a certain input terminal, then the input terminal is fixed, and real data included in the digital signal inputted through the input terminal are processed. Various processes for processing the real data in the case can be conceived.

In one mode, the process for processing the real data is a process to reproduce a digital audio signal as sound. In this mode, a disk where a digital audio signal of music or the like has been recorded following an identifier group is reproduced, and the digital signal reproduced from the disk is inputted to one of the plurality of input terminals in the audio signal processing apparatus. In the audio signal processing apparatus, a read process and a determination process corresponding to the plurality of input terminals are repeated while changing over the input terminal to another. When the identifier is found in an input signal in the determination process during the period of time when a certain input terminal is selected, a process where a digital audio signal supplied to the input terminal is reproduced as sound is continued with the input terminal fixed then.

In another preferred mode, real data following an identifier group include a command to give an instruction to display characters or an image. In this mode, an electronic device monitors a digital signal supplied to each input terminal while changing over the plurality of input terminals from one to another. When an identifier is found in an input signal via a certain input terminal, the input terminal where the identifier is found is fixed, and following real data are received through the input terminal. Characters or an image is displayed in accordance with a command included in the real data.

In further another mode, real data following the identifier group include a program for allowing the electronic device to perform some process (for example, a failure diagnosis program). In this mode, the electronic device monitors a digital signal supplied to each input terminal while changing over the input terminal to another. When an identifier is found in an input signal via a certain input terminal, the input terminal where the identifier is found is fixed. A following program is received through the input terminal, and executed, for example, to perform failure diagnosis. In this manner, according to the present invention, when real data to allow the electronic device to perform some process are given, an input terminal through which the real data will be supplied can be specified on the electronic device side even if the user does not specify the input terminal. Thus, the user is released from any troublesome operation for specifying the input terminal.

The invention claimed is:

1. A firmware rewriting system comprising:
   a recording medium wherein real data and an identifier group are recorded so that the real data and the identifier group are read in order of the identifier group and the real data, the identifier group being formed by repeating an identifier a plurality of times, the identifier group indicating that the real data follows the identifier group; and
   an electronic device including:
   firmware;
   a plurality of input terminals, any one of which can be coupled to any one of a plurality of playback apparatus capable of playing the recording medium, the input terminals configured for simultaneously receiving digital signals respectively produced by any one of the playback apparatus;
   a controller that repeatedly selects the plurality of input terminals one at a time in succession to detect whether the identifier is included in the contents of a received digital signal, and when it detects that the identifier is included in the digital signal being received by the selected input terminal, rewrites the firmware based on the real data included in the digital signal being received by the selected input terminal.

2. The firmware rewriting system according to claim 1, wherein the electronic device includes an operating unit and wherein when detecting that a predetermined operation has been performed upon the operating unit, the controller starts an operation to detect whether the identifier is included in the contents of the received digital signals.

3. The firmware rewriting system according to claim 1, wherein the digital signal is a digital audio signal.

4. A method of rewriting firmware stored in an electronic device, the method comprising the steps of:
   providing a recording medium wherein real data and an identifier group are recorded so that the real data and the identifier group are read in order of the identifier group and the real data, the identifier group being formed by repeating an identifier a plurality of times, the identifier group indicating that the real data follows the identifier group;
   playing the recording medium in a playback apparatus to supply the identifier group and the real data in a digital signal coupled to one of a plurality of input terminals of the electronic device;
   successively selecting the plurality of input terminals one at a time to detect whether the identifier is included in the contents of digital signals respectively coupled to the plurality of input terminals; and
   when it is detected that the identifier is included in the contents of the digital signal coupled to the selected one of the plurality of input terminals, rewriting the firmware based on the real data included in the digital signal coupled to the selected input terminal.

5. The method of rewriting firmware according to claim 4, wherein the digital signal is a digital audio signal.

6. An electronic device comprising:
   firmware;
   an input section that receives a digital signal; and
   a controller that repeats performing a determination operation for determining contents of the digital signal inputted through the input section, and when it confirms that a number of identifiers included in the digital signal inputted through the input section exceeds a predetermined number, rewrites the firmware based on real data which follows the identifiers in the digital signal inputted through the input section,
   wherein the controller determines every determination operation contents of the digital signal on a number of bytes equal to or greater than the number of bytes, B, obtained by the equation $B=(A*X)+(A-1)$, wherein A indicates the number of bytes of the identifier and X designates the predetermined number.

7. The electronic device according to claim 6, wherein the input section includes a plurality of input terminals, any one of which can be coupled to any one of a plurality of playback apparatus capable of playing the recording medium, the input terminals configured for simultaneously receiving digital signals respectively produced by any one of the playback apparatus, and the controller repeatedly selects the plurality of input terminals one at a time in succession to detect whether the identifier is included in the contents of a received digital signal, and when it detects that the identifier is included in the digital signal being received by the selected input terminal, rewrites the firmware based on the real data included in the digital signal being received by the selected input terminal.

8. The electronic device according to claim 6, wherein the digital signal is a digital audio signal.

* * * * *